United States Patent [19]

Bergström

[11] Patent Number: 4,814,600

[45] Date of Patent: Mar. 21, 1989

[54] ELECTROMAGNETIC RADIATION CIRCUIT ELEMENT

[76] Inventor: Arne Bergström, Drottninghamnsvagen 72, 131 46 Nacka, Sweden

[21] Appl. No.: 930,302

[22] PCT Filed: Jan. 22, 1986

[86] PCT No.: PCT/SE86/00021

§ 371 Date: Oct. 24, 1986

§ 102(e) Date: Oct. 24, 1986

[87] PCT Pub. No.: WO86/05338

PCT Pub. Date: Sep. 12, 1986

[30] Foreign Application Priority Data

Feb. 27, 1985 [GB] United Kingdom ............... 8505034

[51] Int. Cl.$^4$ .......................... G01V 9/04; G02B 6/26
[52] U.S. Cl. .................................. 250/221; 250/227; 350/96.15; 341/31
[58] Field of Search ............... 350/56.15; 340/365 P; 250/221, 227, 229

[56] References Cited

U.S. PATENT DOCUMENTS 3,886,544  5/1975  Narodny .................... 340/365 P
3,937,952 10/1976  Ripley et al. ............... 340/365 P
4,254,333  3/1981  Bergström .................. 340/365 P Primary Examiner—Stanley D. Miller
Assistant Examiner—Richard Roseen
Attorney, Agent, or Firm—Fisher, Christen & Sabol

[57] ABSTRACT

A touch-sensitive key particularly for use in a fibre-optic system has a radiation propagating unit (3) with a touching surface (5). Radiation input and output devices, such as optical fibres (1, 2), are arranged respectively to direct radiation at the touching surface (5) through the unit (3) and to receive such radiation scattered from the touching surface (5) through the unit (3). The unit (3) incorporates a radiation collecting arrangement to reduce radiation losses between the input and output devices. In one embodiment this arrangement is achieved by using a unit (3) in the form of an optical-fibre light guide. In a further embodiment the unit (9) has a suitably curved touching surface (10) which has a focusing action. In other embodiments focusing mirrors (19, 22) are used. In order to discriminate between internal radiation and external radiation entering the unit, air gaps (4, 14, 21, 26) may be provided e.g. between the output device and the unit, and also radiation-absorbing material (15, 28, 27).

13 Claims, 2 Drawing Sheets

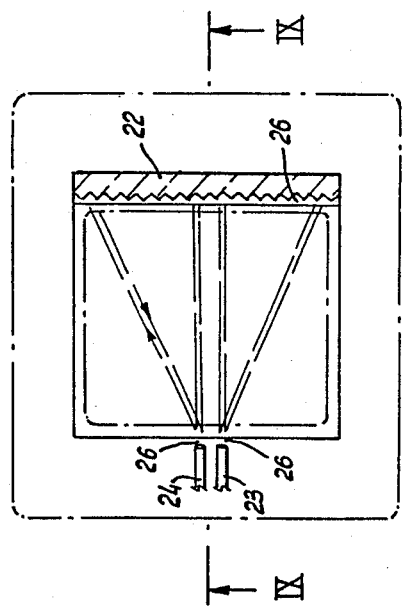
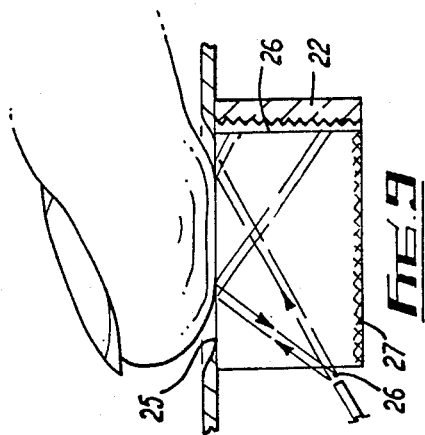
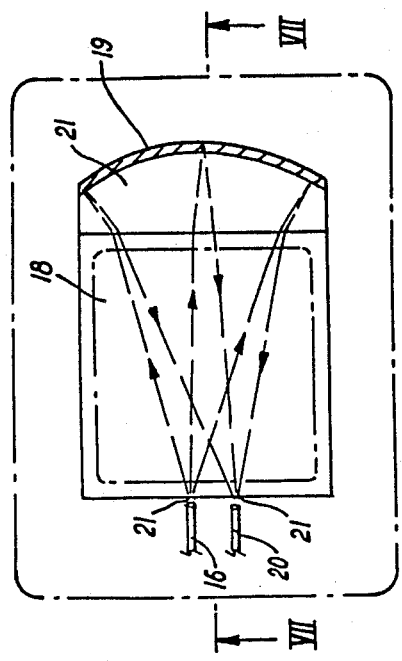
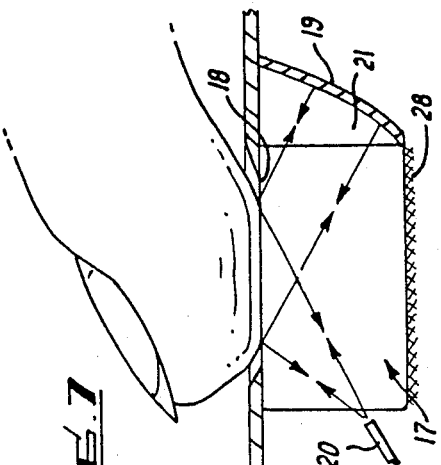

ELECTROMAGNETIC RADIATION CIRCUIT ELEMENT

FIELD OF THE INVENTION

This invention relates to electromagnetic radiation circuit elements generally of the touch-sensitive key type, particularly but not exclusively for use in conjunction with fibre-optic communication systems.

In telecommunications and in demanding process control applications, there is a trend towards the use of light instead of electrical current as the information-carrying medium. Light guides in the form of thin, flexible fibre-optic cables are expected to play an important role in future communication networks and in signal transmission in demanding environments due to their higher information capacity and their insensitivity to electromagnetic transients, as well as their potential in terms of lighter and less bulky cables.

Although the main use of fibre-optic cables will probably be to carry heavy information loads in the form of high-frequency signals there are other applications, such as military use and process control in environments with heavy electromagnetic interference, where fibre-optic communication is in practice the only possibility, and which involve manual input of information e.g. through keyboards. In such applications, a fibre-optic circuit element for manual input of information into the system may be required. The present invention is particularly concerned with such a fibre-optic circuit element, especially in the form of a so-called touch-sensitive key, although the invention may also be used with advantage in optoelectronic applications.

BACKGROUND ART

In man-machine communication there is a trend away from the use of mechanical keys and towards the use of touch-sensitive keys. Touch-sensitive keys have several advantages compared to mechanical keys; they have no moving parts and are thus not subjected to wear, they can more easily be sealed hermetically from the environment, they can be manufactured at a lower cost, and designs with touch-sensitive keys often offer aesthetically more pleasing solutions.

Several concepts for optical touch-sensitive keys are known in the prior art. In IBM Technical Disclosure Bulletin Vol. 18 No. 2 page 483 (July 1975) a fibre-optic switch is described in which the pressure of the finger deforms a foam washer in such a way that reflected light from an optical fibre is prevented from reaching a return fibre.

In Electronic Engineering, April 1981, page 51, several designs are presented in which an approaching finger either reflects or obstructs the light path from a source fibre to a detector fibre. No consideration is given in the mentioned reference to the serious problem of external light, such as from the sun, shining into the system.

None of the above prior art references, however, relates to a true touch-sensitive key in the sense that its function involves no mechanical deformation and that it is activated when and only when the finger touches the sensitive surface.

British Pat. No. 1,600,566 (corresponding to U.S. Pat. No. 4,254,333 and corresponding Patents in other countries) describes a concept for a true optical touch-sensitive key, in which also a complete separation is achieved between, on one hand, external light such as from the sun and, on the other hand, an inner radiation system operable to affect a radiation detector. Despite the fact that said inner radiation system is completely separated from the outside, it is still possible, due to the particular properties of total internal reflection, to affect this inner radiation system by touching the surface of the key. The present invention is concerned with a development of this concept which is particularly suitable for use in a fibre-optic context bearing in mind that an important requirement with a fibre-optic touch-sensitive key is that the light loss in the key should be as small as possible, so as to avoid the need for amplification in connection with the key requiring extra electronic circuitry which would be expensive and also might make the system sensitive to external electromagnetic interference.

One way of reducing light losses would be to focus the light emitted by an input fibre onto an output fibre by means of lenses in front of the input and output fibres, respectively. However, this has the disadvantage that it tends to lead to clumsy designs and also is not ideal with respect to focusing deficiencies leading to light loss. Such deficiencies are inherent in the focusing process and are determined by the ratio of the size of the source to the size of the image-forming surface. For this reason the present invention is mainly concerned with the use of larger image-forming surfaces, such as the touching surface itself. In this sense the present invention displays a superficial resemblance with Derwent's abstract No. H8843 B/37, SU 636-803. This reference, however, relates to a surface of a rotating logarithmic spiral which surface has inferior focusing properties. Said reference also makes no provision for discrimination against ambient light, such as from the sun, which can shine directly onto the photoelectric sensor and cause severe malfunction.

DISCLOSURE OF THE INVENTION

According to the invention therefore there is provided an electromagnetic radiation circuit element comprising a radiation propagating unit between a radiation input device and a radiation output device, said unit being adapted to produce an identifiable change in the radiation which reaches the output device from the input device when a surface of the unit is touched, and provision being made for discriminating at the output device between radiation from the input device and external radiation entering said unit through said surface, characterised in that a collection device is incorporated in said unit to collect radiation from the input and direct this onto the output device via the said touching surface.

With this arrangement, there is the possibility of constructing a touch-sensitive key which has the following properties:

It operates on a purely optical principle; only radiation (visible light, IR or other) is required; no electric components are necessary in the key.

It operates purely as a touch-sensitive key, no moving mechanical parts or deforming media are involved.

It utilises an identifiable change in the total internal reflection of the radiation in an internal ray system when the touching surface is touched by an actuating object such as a finger.

It has negligible sensitivity to ambient light e.g. due to the use of a special geometric configuration.

It demonstrates light economy: there are only small radiation losses for the internal ray system in the key. This is a distinguishing characteristic compared to prior British Pat. No. 1,600,556 and Application No. PCT/SE 84/00031 now U.S. Pat. No. 4,629,884.

In one preferred embodiment the said unit comprises an elongate cylindrical radiation guide having a diameter substantially equal to the radiation-emitting and radiation-receiving diameters of the said radiation input and output devices, the cylindrical surface of the guide defining said collection device and part of said surface also defining said touching surface. The radiation guide may comprise a fibre formed from a transparent material and, by way of example, an optical fibre with the usual peripheral cladding removed may be used.

In an alternative preferred embodiment the said unit comprises a body having a surface of ellipsoid form which defines said touching surface and also said collection device, said input and output devices being disposed respective at or in communication with the foci of the ellipsoid. The input and output devices may be located directly at the respective foci. Equivalent arrangements are also possible. For example, the input device may be arranged at one of the foci and reflector (e.g. a plane mirror) may be arranged at the other of the foci so as to reflect radiation to a different position e.g. at or close to the input device.

In a further alternative preferred embodiment the said unit comprises a body having said touching surface at a top surface thereof, said input and output devices being arranged at one side surface and said collecting device comprising a reflector at an opposite side surface of the body. The reflector may comprise an ellipsoid mirror with two foci, or a spherical mirror with a single focus, or a surface having multiple corners of reflective material arranged to reflect angled incident radiation back along its own path.

The input and output devices may comprise optical fibres connected at ends remote from the said unit to any suitable light source and light detector or the like as appropriate. Alternatively it is possible to use light-emitting diodes and photodiodes or the like close to the said unit.

Preferably there is at least one air gap associated with the said unit and arranged for the purpose of preventing ambient radiation not derived from the input device from reaching the output device. Thus, there may be an air gap between the output device and the unit and/or between the aforesaid reflector (where this is provided) and the unit. An air gap may also be provided between the input device and the unit. Additionally or alternatively, radiation-absorbing material may be applied to a surface of the said unit for the purpose of absorbing ambient radiation not derived from the input device.

More specifically, with the aim of discriminating between internal and external radiation the propagation unit may be as described in U.S. patent application Ser. No. 4,629,884. This application describes an electromagnetic radiation circuit element comprising a radiation propagating unit having a touching surface and a further surface extending at a side of said touching surface, a radiation source arranged to direct radiation into said unit towards said touching surface and a radiation detector facing said side surface, said unit being adapted to produce an identifiable change in the radiation which reaches the detector from the radiation source when the touching surface of the unit is touched by an actuating object such as a finger, characterised in that external radiation entering said unit through said touching surface can leave said unit at said side surface thereof but in a manner substantially insufficient to effect actuation of said detector thereby due to refraction of said external radiation at a surface of the radiation propagating unit.

BRIEF DESCRIPTION OF THE DRAWINGS

The invention will now be described further by way of example only and with reference to the accompanying drawings in which:

FIG. 6 is a view similar to FIG. 1 of a further embodiment;

FIG. 7 is a sectional view on VII—VII of FIG. 6;

FIG. 8 is a view similar to FIG. 1 of a yet further embodiment; and

FIG. 9 is a sectional view on the line IX—IX of FIG. 8.

BEST MODE OF CARRYING OUT THE INVENTION

Figure 1:
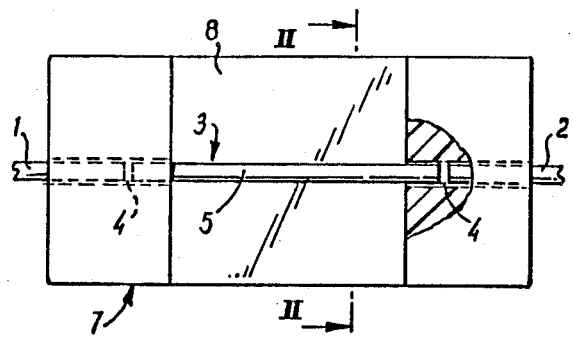
FIG. 1 is a diagrammatic top view of one form of a touch-sensitive key according to the invention.
Figure 2:
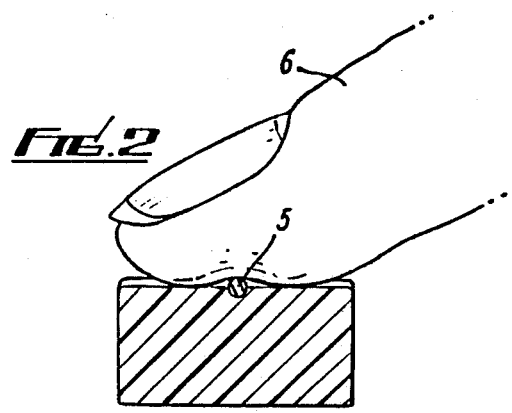
FIG. 2 is a transverse sectional view of the key on the line II—II of FIG. 1.

FIG. 1 shows a fibre-optical touch-sensitive key having an input fibre 1 and an output fibre 2 which are connected to a radiation propagating unit in the form of a cylindrical light guide 3 with the same diameter as the input and output fibres. The light guide 3 can be described as an optical fibre without the optical insulation usually surrounding such fibres to improve their properties and which normally consists of a cladding with a particular radial distribution of refractive index. Multiple light reflections inside the light guide 3 can be damped by pressing a finger 6 against its surface, such damping occurring in the manner described in the previously mentioned British Pat. No. 1,600,556. Multiple reflections take place in the light guide 3 whereby the damping is enhanced compared to the case with only a single reflection.

The touch-sensitive light guide 3 can either be a part of a normal optical fibre from which the cladding has been etched away or, preferably, a cylindrical fibre with the same dimension as the connecting external fibres consisting of glass or other suitable transparent material with refractive index preferably close to that of glass. In order to separate the internal ray system originating from the input fibre from ambient light which also is present in the light guide 3, the input and output fibres 1 and 2 are preferably separated from the light guide 3 by air gaps 4. The configuring and function of such air gaps to separate the inner ray system from ambient radiation are discussed in the previously mentioned British Pat. No. 1,600,556 and also in British patent application No. 8302997 (and corresponding U.S. Pat. No. 4,629,884).

As can be seen from the drawings, the fibres 1, 2 are fixed at their end portions within a generally rectangular substrate block 7 which may be formed from any suitable material. The light guide 3 is set within the same block 7 between and in axial alignment with the ends of the fibres 1, 2. The end portions of the fibres are wholly embedded in the block whereas the central portion of the light guide 3 is exposed over the uppermost half of its circumference. In order to achieve this arrangement, the top surface of the block is recessed in a central region 8. The exposed surface 5 of the light guide defines a touching surface.

With this arrangement, the light economy is achieved by virtue of the fact that the touching surface 5 on the light guide 3 has the same diameter as the input and output fibres 1, 2 whereby light is directed into the output fibre with a minimum of light loss due to the light collecting and guiding properties of the guide 3 and without requiring any focusing device. The disadvantage with this embodiment is that the light guide 3 is very thin which may make it unnecessarily fragile and which makes the way in which it is mechanically integrated with the substrate of the key very important. In the three embodiments described below a larger light guide and touching surface are employed, and the required focusing to achieve satisfactory light economy is attained by reflective means.

Figure 3:
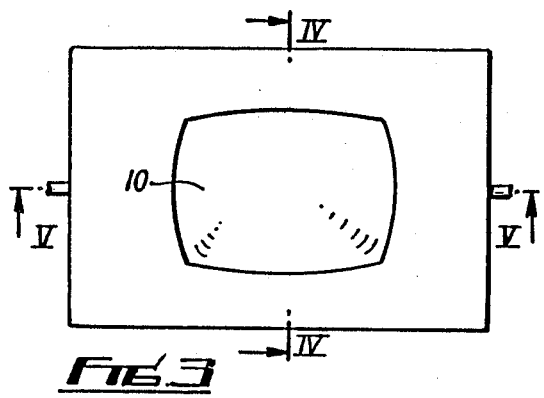
FIG. 3 is a view similar to FIG. 1 of an alternative embodiment.
Figure 4:
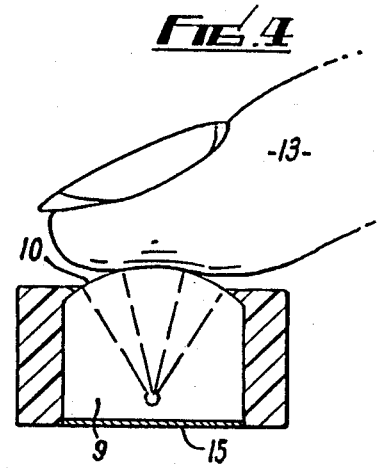
FIGS. 4 and 5 are sectional views respectively on the line IV—IV and V—V of FIG. 3.
Figure 5:
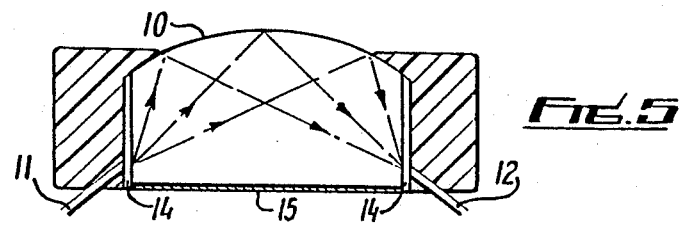

FIGS. 3–5 show a touch-sensitive key having a radiation propagating unit 9 with a touching surface 10 which is in the form of an ellipsoid of revolution with input and output fibres 11, 12 having their ends located respectively at the two foci of the ellipsoid. Due to the reflecting properties of the ellipsoid, light emitted from the input fibre 11 will be collected and reflected into the output fibre 12. Provided that the ellipsoid subtends the entire optical lobes from the input and output fibres, the light loss in the key will thus be negligible at perfect total internal reflection at the touching surface 10. As before, a gentle touch of the touching surface 10 by an actuating object 13, such as a finger, will reduce the internal reflection which reduction can easily be identified at the end of the output fibre 12.

In order to discriminate against external light from, say, the sun shining in through the touching surface 10 the input and output fibres 11, 12 are separated from the unit 9 by air gaps 14 as shown in FIG. 5. Referring again to the abovementioned British Pat. No. 1,600,556, it should be noted that external rays entering through the touching surface 10 will experience total internal reflection at the air gap 14 of the side surfaces, and thus not reach the output fibre 12, if the angle which such a ray forms with the side surface of the light guide 9 is below a certain critical value related to the refractive index n of the light guide 9. According to Snell's Law this critical angle is $v = \arcsin(1/n)$ with respect to the horizontal.

The smallest angle with respect to the touching surface 10 which an external ray can have when refracted into the light guide is $w = \arccos(1/n)$. Thus if no external rays are to be refracted out through the side faces of the light guide, then the maximum angle u which the touching surface in the plane perpendicular to the side faces may form with the horizontal is $u = w - v = \arccos(1/n) - \arcsin(1/n)$.

For a glass-air interface, the refractive index n is close to 1.5 and the angle u is $u = 48.2 - 41.8 = 6.4$ degrees. A sufficient condition to ensure that external light entering through the touching surface 10 will not reach the output fibre 12 outside the side face is thus that the curvature of the touching surface in the plane perpendicular to the side faces is such that the touching surface forms an angle with the horizontal which is less than 6.4 degrees at every point of the touching surface. A higher refractive index will increase the permitted angle, as will having the side faces forming a more obtuse angle with the touching surface. In all embodiments now discussed, it is important in practical terms that absorbing means 15, such as absorbing paint, is arranged at the bottom face of the light guide 9, since otherwise external light could reach the output fibre 12 by multiple reflections in the light guide 9.

In a modification of this embodiment the output fibre 12 may be replaced by a plane mirror so positioned as to reflect the light back to a point close to the input fibre 11 where the output fibre 12 is then placed. It is also possible to let the light be reflected back to the input fibre 11, which would then serve the dual purpose of both input and output fibre, and in which input and output signals are distinguished by their direction of propagation; for an unactivated key the backward propagating radiation would be substantially equal to the forward propagating radiation, whereas a touch would reduce the backward propagating radiation in an identifiable manner.

FIGS. 6 and 7 show an embodiment closely related to the abovementioned British Pat. No. 1,600,556 in which light from an input fibre 16 is transmitted through one of the side faces of a rectangular prism 17 and then internally reflected in the planar touching surface 18. When the rays leave the opposite side surface, they are reflected by a mirror 19, substantially in the form of an ellipsoid of revolution, back towards the touch surface 18, and then after total internal reflection in the touching surface the rays leave through the first side face of the prism to be collected by the output fibre 20. The focusing of the rays from the input fibre 16 onto the output fibre 20 is in this case effected by having the input and output fibres 16, 20, respectively, in the two foci of the ellipsoidal mirror 19 with due allowance for the reflection in the touching surface 18 and refraction in the side surfaces. Again, as is explained above, it is important to have air gaps 21 between the fibres 16, 20 and the prism 17 as well as between the ellipsoidal mirror 19 and the prism 21 in order to discriminate against ambient light, and also light-absorbing material 28.

In a modification of this embodiment the ellipsoidal mirror may be spherical with one fibre in the centre focus and which is used as both input and output fibre in like manner to be above-described modified embodiment of FIGS. 3–5.

FIGS. 8 and 9 show a further embodiment related to the embodiment of FIGS. 6 and 7, in which the ellipsoidal mirror 19 is replaced by a corner-reflecting surface 22. A corner-reflecting surface 22 may consist of tiny orthogonal corners of reflecting material, and has the property that an incident ray will be reflected by the surface back towards the source. A sideward spread of the order of the size of the corner elements is unavoidable, and the light economy in this embodiment is thus inherently somewhat inferior to the ones discussed above. The reflected radiation is then collected by an output fibre 23 located close to the input fibre 24, or by the input fibre itself in the case that this fibre is used for both input and output as discussed above. This embodiment also has a planar touching surface 25 and air gaps 26 and light-absorbing material 27.

Several modifications to the embodiments described above are possible within the scope of the invention. In particular, the input and output fibres may be replaced by ordinary optoelectronic components such as light-emitting diodes and photodiodes, in which case the invention provides a superior light economy compared to the solutions in the prior art.

I claim:

1. An electromagnetic radiation circuit element comprising a radiation input device, a radiation output device, a radiation propagating unit having a touching surface thereto and disposed optically between said input and output devices so as to transmit radiation from said input device to said output device through said unit after internal reflection of said radiation at said touching surface whereby there is an identifiable change in said radiation reaching said output device from the input device when the touching surface is touched, disciminating means disposed before said output device for separating out external radiation entering said unit through said surface from said radiation from said input device, said touching surface being curved so as to act additionally as a collection device to collect the said radiation from the input device and direct this onto the output device.

2. A radiation circuit element according to claim 1, wherein the said unit comprises an elongate cylindrical radiation guide having a diameter substantially equal to radiation-emitting and radiation-receiving diameters of the said radiation input and output devices, the cylindrical surface of the guide defining said collection device and part of said surface also defining said touching surface.

3. A radiation circuit element according to claim 2, wherein said radiation guide comprises a fiber formed from a transparent material.

4. A radiation circuit element according to claim 1, wherein the said unit comprises a body having a surface of ellipsoid form which defines said touching surface and also said collection device, said input and output devices being disposed respectively at or in communication with the foci of the ellipsoid.

5. An electromagnetic radiation circuit element comprising a radiation input device, a radiation output device, a radiation propagating unit comprising a body having a top surface which is a touching surface and first and second side surfaces opposite to each other, said bodies being disposed optically between said input and output devices so as to transmit radiation from said input device to said output device through said unit after internal reflection of said radiation at said touching surface whereby there is an identifiable change in said radiation reaching said output device from the input device when the touching surface is touched, discriminating means disposed before said output device for separating out external radiation entering said unit through said touching surface from said radiation from said input device, and a collection device comprising a reflector at said second side surface of said unit between said input and output devices to collect the said radiation from the input device and direct this onto the output device whereby said radiation from the input device is transmitted via both said touching surface and said collecting device to said output device, wherein said input and output devices are arranged at said first side surface of said body, and wherein said discriminating means comprises at least one air gap arranged so as to prevent ambient radiation from reaching said output device.

6. A radiation circuit element according to claim 5, wherein the reflector comprises an ellipsoid mirror, the input and output devices being arranged respectively at the two foci of the mirror.

7. A radiation circuit element according to claim 5, wherein the reflector comprises a spherical mirror and there is a common input and output device or closely adjacent such devices arranged at the focus of the mirror.

8. A radiation circuit element according to claim 5, wherein the reflector comprises a surface having multiple corners of reflective material whereby incident radiation at an angle to the surface is reflected back along its own path.

9. A radiation circuit element according to claim 5 wherein said air gap is provided between said reflector and said body.

10. An electromagnetic radiation circuit element comprising a radiation input device, a radiation output device, a radiation propagating unit having a touching surface thereto and disposed optically between said input and output devices so as to transmit radiation from said input device to said output device through said unit after internal reflection of said radiation at said touching surface whereby there is an identifiable change in said radiation reaching said output device from the input device when the touching surface is touched, discriminating means disposed before said output device for separating out external radiation entering said unit through said surface from said radiation from said input device, and a collection device incorporated in said unit between said input and output devices to collect the said radiation from the input device and direct this onto the output device whereby said radiation from the input device is transmitted via both said touching surface and said collecting device to said output device, and wherein the discriminating means comprises at least one air gap associated with the said unit and arranged for the purpose of preventing ambient radiation from reaching the output device.

11. A radiation circuit element according to claim 10, wherein said input and output devices comprise optical fibers.

12. A radiation circuit element according to claim 10, wherein said air gap is provided between the input and output device and the unit.

13. An electromagnetic radiation circuit element comprising a radiation input device, a radiation output device, a radiation propagating unit having a touching surface thereto and disposed optically between said input and output devices so as to transmit radiation from said input device to said output device through said unit after internal reflection of said radiation at said touching surface whereby there is an identifiable change in said radiation reaching said output device from the input device when the touching surface is touched, discriminating means disposed before said output device for separating out external radiation entering said unit through said surface from said radiation from said input device and a collection device incorporated in said unit between said input and output devices to collect the said radiation from the input device and direct this onto the output device whereby said radiation from the input device is transmitted via both said touching surface and said collecting device to said output device, and wherein the discriminating means comprises radiation absorbing material applied to a surface of the said unit for the purpose of absorbing ambient radiation.

* * * * *